United States Patent
Corron et al.

(10) Patent No.: US 6,216,093 B1
(45) Date of Patent: Apr. 10, 2001

(54) METHOD AND APPARATUS FOR COMMUNICATION WITH CHAOTIC AND OTHER WAVEFORMS

(75) Inventors: Ned J. Corron, Madison; Daniel W. Hahs, Huntsville, both of AL (US)

(73) Assignee: Dynetics, Inc., Huntsville, AL (US)

( * ) Notice: Subject to any disclaimer, the term of this patent is extended or adjusted under 35 U.S.C. 154(b) by 0 days.

(21) Appl. No.: 09/071,556

(22) Filed: May 1, 1998

Related U.S. Application Data

(62) Division of application No. 08/751,352, filed on Nov. 15, 1996, now Pat. No. 5,857,165.

(60) Provisional application No. 60/006,954, filed on Nov. 17, 1995, and provisional application No. 60/022,054, filed on Jul. 22, 1996.

(51) Int. Cl.[7] .................................................. G06G 7/38
(52) U.S. Cl. ........................ 702/57; 702/190; 380/263; 703/2
(58) Field of Search .................. 702/57, 73–76, 702/190, 17, 62, 69, 70, 106, 107, 111, 122, 191, 194, 195, 197, 199, 117, 118, 124, 126, FOR 107, FOR 108, FOR 110, FOR 155, FOR 164, FOR 166, FOR 167; 329/315–317; 455/143; 331/44, 1 R, 41, 78; 395/500.34, 500.35, 500.41; 708/300, 309, 311, 444, 815, 819, 823, 824, 250; 324/613, 612, 614, 620, 76.17, 76.23, 76.93, 76.44–76.46; 380/263; 703/2–4, 13, 14, 18

(56) References Cited

U.S. PATENT DOCUMENTS

| | | | |
|---|---|---|---|
| 5,379,346 | * | 1/1995 | Pecora et al. .................... 380/263 |
| 5,655,022 | * | 8/1997 | Carroll .............................. 380/263 |
| 5,680,462 | * | 10/1997 | Miller et al. ...................... 380/263 |

* cited by examiner

*Primary Examiner*—Hal Wachsman
(74) *Attorney, Agent, or Firm*—Needle & Rosenberg, P.C.

(57) ABSTRACT

A method and apparatus for communicating with chaotic and other waveforms employs a filter for estimating a parameter that describes a property of a signal. The filter is constructed by defining a system that models the source of the signal. The system is partitioned into a first subsystem that contains the parameter and a second subsystem that does not contain the parameter, the second subsystem including a term that makes the second subsystem stable and synchronizable with the signal. The signal is introduced as input to the second subsystem and an element of the second subsystem is substituted into a corresponding element of the first subsystem, thereby generating a signal-activated subsystem. An integration factor is introduced to the signal-activated subsystem to cause the parameter to behave as a constant when the signal-activated subsystem with the integration factor is integrated with respect to time. The signal-activated subsystem is integrated with respect to time with the integration factor, generating an equation of integrals in which the parameter is brought out of any of the integrals containing the parameter. The equation of integrals is solved for the parameter so that a multiple of the parameter is expressed as a combination of integrals, which is applied to a low-pass filter to inhibit any singularities in the combination of integrals, thereby generating a filtered combination of integrals. A circuit is constructed from a plurality of circuit elements, each circuit element being an analog of an integral of the filtered combination of integrals.

4 Claims, 7 Drawing Sheets

METHOD AND APPARATUS FOR COMMUNICATION WITH CHAOTIC AND OTHER WAVEFORMS

CONTINUING DATA

This application is a divisional of U.S. patent application Ser. No. 08/751,352, which is now U.S. Pat. No. 5,857,165, filed on Nov. 15, 1996, and issued on Jan. 5, 1999.

REFERENCE TO PROVISIONAL APPLICATIONS

This application for letters patent claims priority under 35 U.S.C. §119(e) on two provisional patent applications, Ser. Nos. 60/006,954, filed on Nov. 17, 1995, and 60/022,054, filed on Jul. 22, 1996.

BACKGROUND OF THE INVENTION

1. Field of the Invention

The present invention relates to communication systems and, more specifically, to devices for estimating parameters to facilitate the demodulation of the signals including chaotic waveforms.

2. Description of the Prior Art

Recent advances in the understanding of nonlinear circuits have shown that chaotic oscillators can synchronize or become entrained. This result appears to contradict the definition of chaos: complex, unpredictable dynamics of a deterministic system characterized most commonly as extreme sensitivity to initial conditions. However, if certain mathematical requirements are met, then a chaotic circuit (called the driving system) can be designed to drive a similar system (the receiving circuit or subsystem) and obtain a correlated response.

Several existing systems employ chaotic synchronization to achieve secure communications by using the chaotic signal to mask the secure information. In one approach, a chaotic signal is added to the communications channel, thereby hiding the information signal. At the receiver, a synchronous subsystem is used to identify the chaotic part of the signal, and the chaotic part is then removed to reveal the information signal. Presumably, the security in this approach is due to the difficulty in identifying and removing the chaotic signal from the noise.

A second approach uses a shift-key approach, in which an information signal is encoded using a different chaotic attractor for each symbol to be transmitted. The resulting waveform is a sequence of chaotic bursts, each generated by an attractor corresponding to a symbol of the discrete information signal. Upon reception, separate receiver subsystems, one for each possible symbol, are used to identify the bursts by detecting which of the multiple receiver subsystems has synchronized. This approach is limited to digital modulation and requires a more complex receiver than the present approach.

In one application, communication is achieved by detecting parameter mismatch between the transmitter and the receiver by looking at the power contained in the difference between the received signal and a replica generated using cascaded synchronous subsystems. These schemes recognize that this error signal is proportional to the mismatch, which is present due to parameter modulation at the transmitter, thereby providing a crude method for demodulation. This approach allows for analog modulation and demodulation; however, it will suffer when noise is present in the system.

An inverse system approach for decoding the modulation of a chaotic waveform effectively demodulates the signal by algebraically inverting part of the circuit. Other forms of communications using chaotic waveforms have been postulated in the literature, including techniques called phase space location modulation and chaotic digital encoding.

No device or method exists which estimates a modulation parameter in real time to emodulate a signal, such as a chaotic signal.

SUMMARY OF THE INVENTION

The disadvantages of the prior art are overcome by the present invention which is an apparatus for communicating using waveforms generated using linear and nonlinear oscillators. In general, these waveforms may be periodic, quasi periodic, or chaotic. In the first embodiment disclosed, chaotic waveformns will be emphasized since they are the most general of these descriptors and the other waveform types can be considered simpler, degenerate forms of chaos. This embodiment of the present invention comprises two parts (1) method of modulating signal onto an oscillator in a transmitter, and (2) a filter for demodulating the signal at the receiver. This approach, can be applied to a wide range of nonlinear systems and waveforms.

One existing approach for communication with chaotic waveforms employs a chaotic nonlinear oscillator as the transmitter and a synchronous subsystem for the receiver. The present approach can fit within this construct, although the invention is not limited to chaotic systems, nor does it require a synchronous subsystem for implementation. In the transmitter, an analog information signal is encoded on the carrier through parameter modulation of an oscillator. The proper choice of a transmitted state and modulation parameter ensures perfect tuning of a synchronous subsystem in the receiver, independent of the modulation. In alternative embodiments, the invention can be implemented without a synchronous subsystem in the receiver by transmitting all the oscillator states which define the attractor. The receiver also contains a filter designed specifically to extract the signal from the modulated waveform. With this filter, the transmitted information is continuously decoded at the receiver.

The present invention employs two aspects: (1) parameter modulation that allows the receiver subsystem to always remain in tune, and (2) a nonlinear filter for continuous demodulation of the analog signal carried by the chaotic waveform. The invention allows for the modulation and demodulation of both analog and digital signals. Furthermore, the resulting system can be easily and inexpensively implemented using simple electrical circuitry, thereby making the technique feasible for practical communications applications.

Many prior art approaches to chaotic communications assume that the chaotic dynamics are much faster than those of the modulation. This assumption parallels the usual approach in conventional communications where the carrier signal is at a much higher frequency than the signal. Presumably, these approaches view the chaotic waveform as a carrier waveform that, for example, operates with radio frequency (RF) dynamics. In the invention, on the other hand, the time scales of the nonlinear dynamics and modulation do not have to be separated. In fact, by allowing the frequency spectra of the modulation and the carrier to overlap, this invention allows for encryption of the message signal with little or no increase in the signal bandwidth. By building such a system that operates in the range from 300 to 3000 Hz, efficient audio scrambler-descrambler systems can be built that are suitable for use with voice communications over existing phone lines.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1:
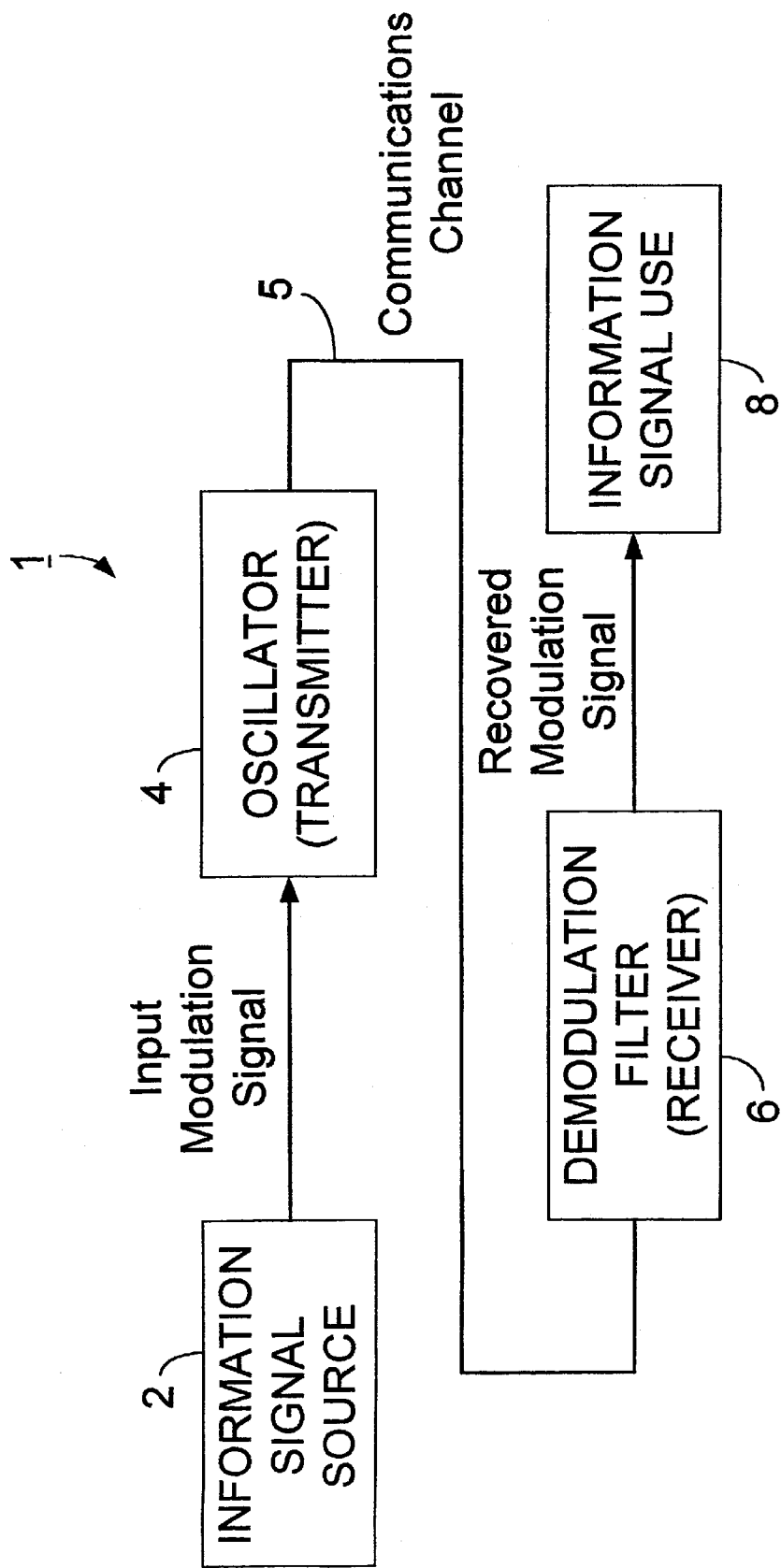
FIG. 1 is a block diagram showing a communications architecture incorporating parameter modulation and a demodulation filter in accordance with the invention.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: "a," "an," and "the" includes plural reference, "in" includes "in" and "on."

1. Theoretical Basis for the Invention

As shown in FIG. 1, a communications system 1, of the type employed herein, has an information signal source 2 that is supplied to a transmitter/oscillator 4, which encodes the information signal onto a carrier wave through a modulation parameter and transmits a modulated signal over a communications channel 5. A receiver/demodulation filter 6 extracts the information signal 8 from the modulated signal. The proper choice of drive channel and modulation parameter ensures perfect tuning of a synchronous subsystem in the receiver 6.

The general theory defining the invention is best described mathematically. For definiteness, the theory is presented for only a third-order oscillator, although the invention can be applied to systems of other orders. Consider an oscillator of the form:

$$\dot{x}=f(x,y,z;\lambda)$$
$$\dot{y}=g(x,y,z)$$
$$\dot{z}=h(x,y,z) \quad (1)$$

where x, y, and z define the states of the system, $\lambda$ is a parameter in the system, and the independent variable is time t. The oscillator in (1) may or may not be chaotic; however, it is expedient to assume that the oscillator is chaotic and that the system behavior changes smoothly with $\lambda$ over some continuous region of parameter values. The drive subsystem of equation (1) would be employed in the transmitter/oscillator 4 shown in FIG. 1.

A synchronous subsystem for (1) can be constructed of the form $$\dot{y}_r=g(x,y_r,z_r)$$
$$\dot{z}_r=h(x,y_r,z_r) \quad (2)$$

where the x-state from the drive system (1) is transmitted to the receiving system (2). It has been shown in the literature that, quite remarkably, the states $y_r$ and $z_r$ in (2) can approach the original states y and z in (1); when they do, it is said that the receiving subsystem (2) synchronizes with the nonlinear system in (1). Researchers have further determined that necessary conditions for synchronization are based on conditional Liapunov exponents. The subsystem (2) would be employed in the receiver 6.

The drive subsystem of equation (1) and synchronous receiver subsystem of equation (2) are a special forms with regard to the parameter $\Delta$: the subsystem of equation (2) was purposely chosen to be independent of the parameter. As the first part of the invention, it is recognized that the parameter $\lambda$ is ideally suited for modulating the chaotic waveform being transmitted from equation (1) to equation (2). That is, let $$\lambda=\lambda(t) \quad (3)$$

be a prescribed function of time that represents the information to be communicated. In equation (3), it is assumed that $\lambda$ is well behaved so as to not destroy the underlying structure of the system in equation (1). The quantity in equation (3) corresponds to the input modulation signal from the information signal source 2.

The proposition that $\lambda$ is ideal for parameter modulation is supported by two observations. First, since the subsystem of equation (2) is independent of the modulation parameter $\lambda$, the receiver can be "perfectly tuned" to the transmitter in equation (1) regardless of the modulation. In contrast, if $\lambda$ were present in the receiver system of equation (2), a parameter mismatch would be unavoidable as the signal is modulated. This mismatch would compromise the ability of the receiver to synchronize with the transmitter, and the capability for communication could be reduced. Second, the x-equation, which is not present in the subsystem of equation (2), can be incorporated at the receiver to demodulate the signal.

As a first consideration, demodulation can be performed as $$\lambda=f^{-1}(x,y_r,z_r;\dot{x}) \quad (4)$$

where $f^{-1}$ represents the inverse function obtained by solving the x-equation for the parameter $\lambda$. In principle, everything on the right side of equation (4) is known and $\lambda$ can be estimated; in practice, this approach suffers for two reasons. First, $\dot{x}$ must be estimated from x at the receiver, and differentiation magnifies errors due to noise in the system. Second, the inverse function in equation (4) often contains singularities that adversely impact parameter estimates.

The second aspect of the invention is a filter for demodulating the signal in equation (3), which avoids the two problems indicated in the previous paragraph. To present this filter, the system of equation (1) is restricted by assuming that f is linear in $\lambda$. That is, $$f(x,y,z;\lambda)=f_0(x,y,z)+\lambda f_1(x,y,z) \tag{5}$$

Often, the form in equation (5) can also be obtained if f is nonlinear by assuming small variations of $\lambda$. With the assumption of equation (5), the naive estimate in equation (4) is simply $$\lambda = \frac{\dot{x} - f_0(x, y_r, z_r)}{f_0(x, y_r, z_r)} \tag{6}$$

The process of building a filter for demodulation begins by substituting equation (5) into the first equation of equation (1), yielding $$\dot{x}=f_0(x,y_r,z_r)+\lambda f_1(x,y_r,z_r) \tag{7}$$

It is desirable to integrate equation (7) to get rid of $\dot{x}$. However, it is undesirable to introduce a requirement to know something about the initial conditions. To this end, adding a decay term kx to both sides of equation (7) and multiplying by an integration factor $e^{kt}$ yields $$\frac{d}{dt}(xe^{kt}) = e^{kt}[f_0(x, y_r, z_r) + \lambda f_1(x, y_r, z_r) + kx] \tag{8}$$

In this, k>0 is an arbitrary constant, which can be adjusted to improve the output of the demodulation filter. Integrating from a start time $t_0$ to the current time t and dividing by the integration factor gives $$x - x_0 e^{k(t_0 - t)} = \int_{t_0}^{t} [f_0(x, y_r, z_r) + kx] e^{k(\tau - t)} d\tau + \int_{t_0}^{t} [f_1(x, y_r, z_r)] e^{k(\tau - t)} d\tau \tag{9}$$

where $x_0$ is an initial condition applied at $t=t_0$. Rigorously, $\lambda$ varies with time; however, it is assumed that $\lambda$ varies slowly compared to the time constant contained in k. Thus, $\lambda$ can be factored out of the integral in equation (9). In addition, the term in equation (9) containing the initial condition $x_0$ becomes small as time increases; therefore, it is negligible. As a result, equation (9) can be simplified to provide an estimate for the modulation parameter as $$\lambda = \frac{x - w_0}{w_1} \tag{10}$$

where $$w_0 = \int_{t_0}^{t} [f_0(x, y_r, z_r) + kx] e^{k(\tau - t)} d\tau \tag{11}$$

and $$w_1 = \int_{t_0}^{t} [f_1(x, y_r, z_r)] e^{k(\tau - t)} d\tau \tag{12}$$

The estimate given by equations (10), (11), and (12) is an improvement over the estimate in equation (6) in that $\dot{x}$ is not required.

The quantities $w_0$ and $w_1$ are not easily computed using the explicit forms in equations (11) and (12). Differentiating equations (11) and (12) using Leibnitz' rule gives the simpler forms $$\dot{w}_0 = f_0(x,y_r,z_r)+kx-kw_0$$

$$\dot{w}_1 = f_1(x,y_r,z_r)-kw_1 \tag{13}$$

with initial conditions $w_0(t_0)=0$ and $w_1(t_0)=0$. The system in equation (13) is more practical for continuous integration than that in equations (11) and (12). The filter equations in (13) are employed in the receiver 6 shown in FIG. 1.

The instantaneous demodulation estimate in equation (10) is singular for $w_1=0$, and an estimate for $\lambda$ will suffer for small $w_1$. In practice, this singularity appears as "spikes" in the estimate for $\lambda$. To remove these "spikes," a low-pass filter is defined as $$\dot{\lambda}_f = q_f(\lambda - \lambda_f) \tag{14}$$

where $\lambda$ is given by equation (8). To avoid the singularity, the filter parameter $q_f$ is defined as $$q_f = \frac{q|w_1|}{1+|w_1|} \tag{15}$$

where q is an arbitrary parameter that sets the time constant of the filter. Combining equations (10), (14), and (15) yields $$\dot{\lambda}_f = \frac{q \, sgn(w_1)}{1+|w_1|}(x - w_0 - w_1 \lambda_f) \tag{16}$$

where sgn represents the signum function. The quantity $\lambda_f$ is then a filtered estimate for the modulation parameter $\lambda$ and is the recovered modulation signal 8 shown in FIG. 1.

2. An Illustrative Hardware Embodiment of a Chaotic System.

The communications architecture described previously has been implemented in an electrical circuit. This communications system is based on Chua's circuit (a chaotic circuit generally known to the art), which is a simple electronic circuit widely used for demonstrating nonlinear dynamics and chaos.

Figure 2:
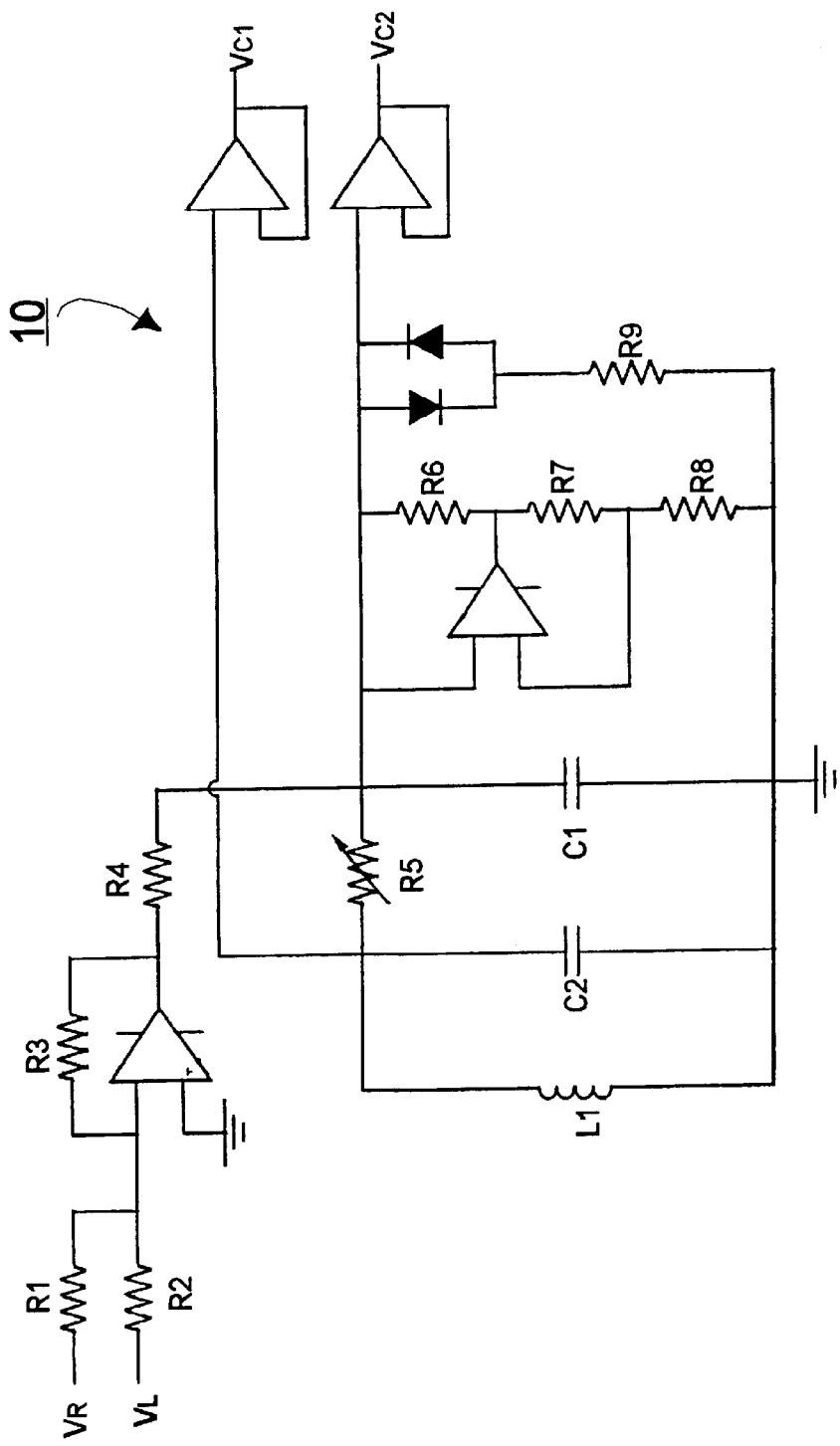
FIG. 2 is a schematic diagram of a modulated transmitter incorporating a chaotic oscillator.
Figure 3:
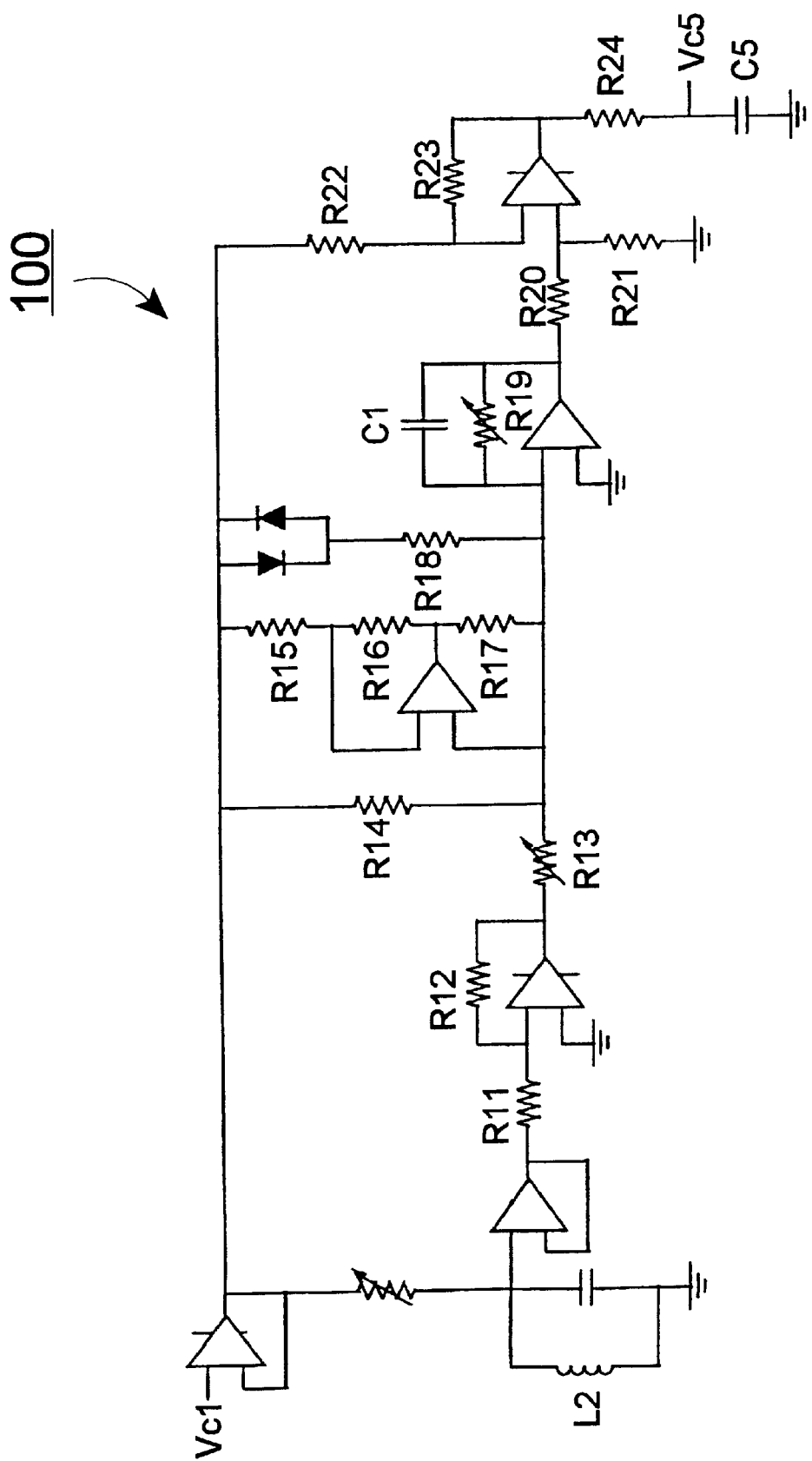
FIG. 3 is a schematic diagram of a receiver incorporating a nonlinear demodulation filter, in accordance with the invention, matched to the transmitter embodiment shown in FIG. 2.

As shown in FIG. 2, the transmitter 10 is described mathematically by a dimensionless system of ordinary differential equations, which are $$\frac{dx}{dt} = \alpha[y - (1+\gamma)x - f(x) + \lambda]$$

$$\frac{dy}{dt} = x - y + z$$

$$\frac{dz}{dt} = \beta y \tag{17}$$

where $$f(x) = ax + \frac{b-a}{2}(|x+1| - |x-1|) \tag{18}$$

In the system equation (17), the nondimensional independent variable $\tau$ is related to time t as $$\tau = \frac{t}{R_8 C_2} \tag{19}$$

The dependent states are $$x = \frac{v_{C1}}{V_{on}} \tag{20}$$

$$y = \frac{v_{C2}}{V_{on}}$$

$$z = \frac{R_5 i_{L1}}{V_{on}}$$

where $V_{on}$ is the voltage drop for a diode in the forward bias (~0.7 V for a silicon diode). The various dimensionless parameters are defined as $$\alpha = \frac{C_1}{C_2} \tag{21}$$

$$\beta = \frac{R_5^2 C_2}{L_1}$$

$$\gamma = \frac{R_5}{R_4}$$

$$a = \frac{R_5}{R_9} - \frac{R_5 R_7}{R_6 R_8}$$

$$b = \frac{2R_5}{R_9} - \frac{R_5 R_7}{R_6 R_8}$$

The input modulation is represented as $$\lambda = \frac{R_3 R_5}{V_{on} R_4} \left( \frac{v_R}{R_1} + \frac{v_L}{R_2} \right) \tag{22}$$

where $v_R$ and $v_L$ are two input voltages. The use of two separate inputs is motivated by the stereo channels available in common audio sources (e.g., a stereo tape deck) used for demonstrating the communication system. Since this demonstration system can transmit only one information channel, a simple mixer is incorporated at the input to generate a monophonic representation of the audio signal.

The system in equation (17) reverts to a standard, unmodulated Chua system for $\gamma=0$ and $\lambda=0$. In the circuit of FIG. 2, this is easily obtained by removing $R_4$ and effectively realizing an infinite resistance for $R_4$.

Figure 5:
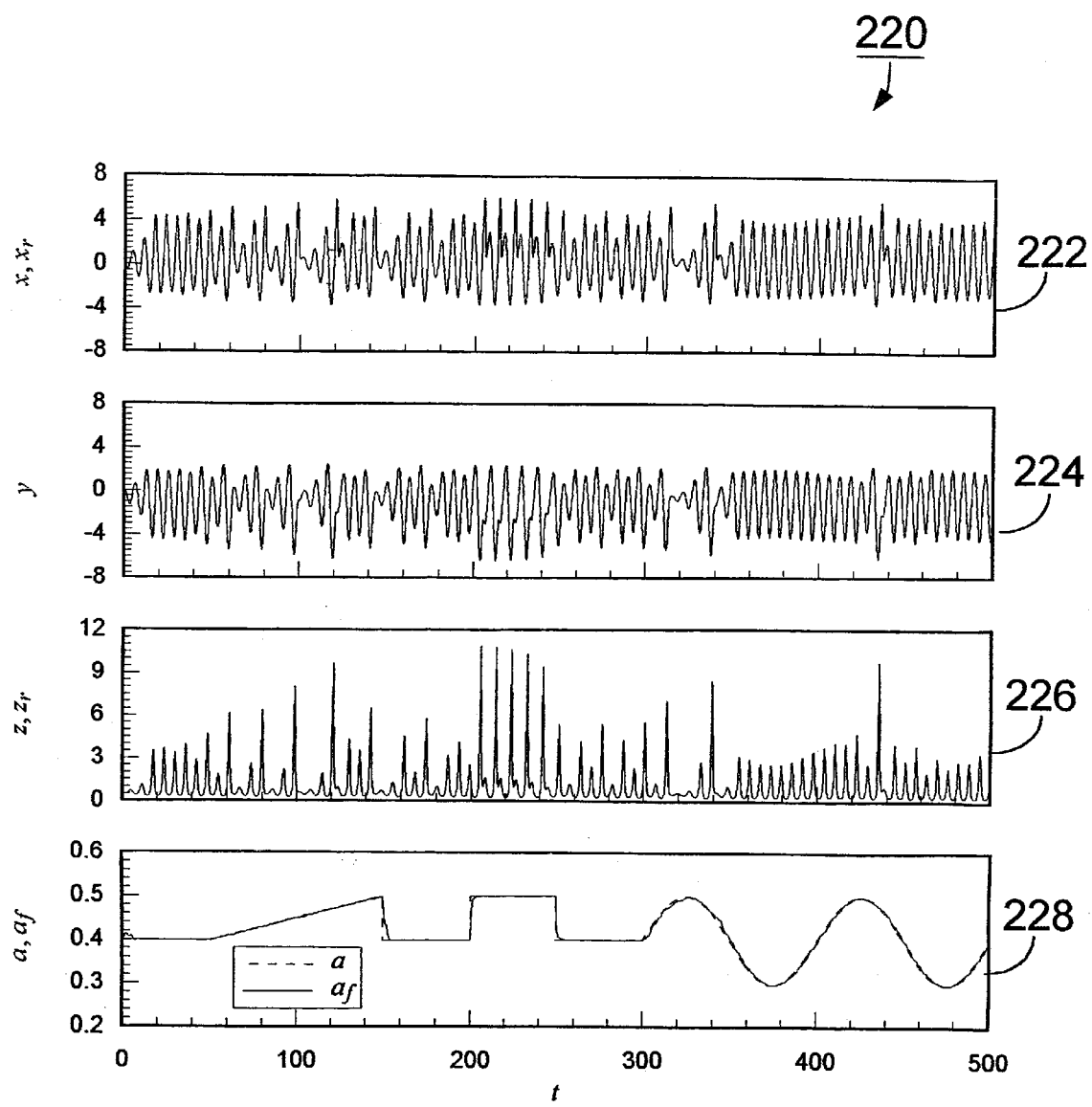
FIG. 5 comprises four graphs showing simulation results for a communication system based on a Rossler chaotic oscillator.

The receiver for this system is shown in FIG. 5, and is modeled nondimensionally as $$\frac{dy_r}{dt} = x - y_r + z_r \tag{23}$$

$$\frac{dz_{rx}}{dt} = \beta y_r$$

$$\frac{dw_0}{dt} = \alpha[y_r - (1+\gamma)x - f(x)] - kx - kw_0$$

$$\frac{d\lambda_f}{dt} = q\left[\frac{k}{\alpha\gamma}(w_0 - x) - \lambda_f\right]$$

Due to the form of the modulation, the equation for $w_1$ (as presented in equation (13) of the general theory) reduces trivially to a constant; thus, it is not explicitly stated.

In the dimensionless system of equation (23), the dependent states are $$y_r = \frac{v_{C3}}{V_{on}} \tag{24}$$

$$z_r = \frac{R_5 i_{L2}}{V_{on}}$$

$$w_0 = \frac{v_{C4}}{V_{on}}$$

$$\lambda_f = \frac{v_{C5}}{V_{on}}$$

The two filter constants are $$k = \frac{R_5 C_2}{R_{19} C_1} \tag{25}$$

$$q = \frac{R_5 C_2}{R_{24} C_5}$$

In order to match the receiver to the transmitter, the following design constraints are imposed:

$L_2 = L_1$ $C_3 = C_2$ $C_4 = C_1$ $R_{10} = R_{13} = R_{19} = R_5$ $R_{11} = R_{12}$ $R_{14} = R_4$ $R_{15} = R_8$ $R_{16} = R_7$ $R_{17} = R_6$ $R_{18} = R_9$ $R_{20} = R_2$ $R_{22} = R_{23} \tag{26}$ These constraints are sufficient conditions to assure tuning the receiver characteristics to those of the transmitter. However, these are not necessary conditions, as other configurations are also possible.

In practice, $R_5$ is adjusted to obtain a suitable chaotic carrier waveform; therefore, $R_5$ will be implemented in the circuit using a potentiometer. As such, similar potentiometers are used for $R_{10}$, $R_{13}$, and $R_{19}$. These three potentiometers allow tuning the receiver for optimal output audio quality and provide a capability to compensate, to some extent, for imprecision in other matched circuit components. Convenient resistor values are chosen for the matched pairs $R_{11} = R_{12}$, $R_{20} = R_{21}$, and $R_{22} = R_{23}$, and the time constant $R_{24} C_5$ is chosen to set the filter parameter q.

Table 1 summarizes actual circuit values used for implementing the communications system in this embodiment. All component values in this table are listed as nominals, and all resistors are rated at 5% tolerance.

TABLE 1

Circuit component values used to demonstrate communications system.

| Component | Value |
|---|---|
| $L_1$ | 1.8 mH |
| $L_2$ | 1.8 mH |
| $C_1$ | 0.001 μF |
| $C_2$ | 0.01 μF |
| $C_3$ | 0.01 μF |
| $C_4$ | 0.001 μF |
| $C_5$ | 0.1 μF |

TABLE 1-continued

Circuit component values used to demonstrate communications system.

| Component | Value |
|---|---|
| $R_1$ | 10 KΩ |
| $R_2$ | 10 KΩ |
| $R_3$ | 12 KΩ |
| $R_4$ | 12 KΩ |
| $R_5$ | 5 KΩ pot. |
| $R_6$ | 220 Ω |
| $R_7$ | 220 Ω |
| $R_8$ | 750 Ω |
| $R_9$ | 1.2 KΩ |
| $R_{10}$ | 5 KΩ pot. |
| $R_{11}$ | 12 KΩ |
| $R_{12}$ | 12 KΩ |
| $R_{13}$ | 5 KΩ pot. |
| $R_{14}$ | 12 KΩ |
| $R_{15}$ | 750 Ω |
| $R_{16}$ | 220 Ω |
| $R_{17}$ | 220 Ω |
| $R_{18}$ | 1.2 KΩ |
| $R_{19}$ | 5 KΩ pot. |
| $R_{20}$ | 10 KΩ |
| $R_{21}$ | 10 KΩ |
| $R_{22}$ | 12 KΩ |
| $R_{23}$ | 12 KΩ |
| $R_{24}$ | 3.3 KΩ |

Additional circuit components used are summarized in Table 2. The components in this table are not critical, and other comparable devices can be substituted.

TABLE 2

Additional circuit component used to demonstrate communications systems.

| Component | Device |
|---|---|
| $U_1$ | TL082, Dual BiFET OpAmp |
| $U_2$ | TL082, Dual BiFET OpAmp |
| $U_3$ | TL082, Dual BiFET OpAmp |
| $U_4$ | TL082, Dual BiFET OpAmp |
| $U_5$ | TL082, Dual BiFET OpAmp |
| $D_1$ | 1N914 Silicon Diode |
| $D_2$ | 1N914 Silicon Diode |
| $D_3$ | 1N914 Silicon Diode |
| $D_4$ | 1N914 Silicon Diode |

For these values, the circuit is adjusted to yield a suitable chaotic carrier with $R_5$=1.315 KΩ.

By adjusting the potentiometers $R_{10}$, $R_{13}$, and $R_{19}$, the receiver circuit can be tuned for optimal audio output. For this tuning, a variety of audio signals can be used and can be judged on balancing signal clarity and reduced noise contamination. For this particular implementation, the suitable tuning was can be achieved with $$R_{10}=1.332 \text{ K}\Omega$$

$$R_{13}=1.526 \text{ K}\Omega$$

$$R_{19}=1.361 \text{ K}\Omega \tag{27}$$

In this tuning, the output audio quality is most sensitive to $R_{19}$. For this implementation, the output sound quality approaches that of standard AM radio transmissions. Certainly, voice signals are clear and easily understood.

Synchronization is achieved by adjusting $R_{10}$. Theoretically, $R_{10}$ should match $R_5$; however, imprecision in other "matched" circuit components results in a slight deviation of these two resistors.

One of the important benefits of this communications architecture is that synchronization is maintained in the receiver even in the presence of nonzero modulation. Specifically, the theory predicts that the receiver does not go out of tune as the transmitter is modulated. This follows from the choice of using a modulation parameter that does not appear in the synchronous subsystem. This design results in a consistent signal quality even for moderately large modulation signals.

3. Computer Simulations of Chaotic Systems Employing the Invention

The Lorenz system has been widely used for studying chaos and synchronization. This third-order system is $$\dot{x}=\sigma(y-x)$$

$$\dot{y}=rx-y-xz$$

$$\dot{z}=xy-bz \tag{28}$$

where x, y, and z are the states of the system and σ, r, and b are fixed parameters.

It has been shown that two stable subsystems can be constructed from (28), and they are the x-z and y-z subsystems. For the present example, the x-z subsystem is used to demonstrate the communication system. Thus, y is the transmitted component of (28), correspondingly, r=r(t) is chosen for the modulation parameter.

Explicitly, the system in (28) constitutes the transmitter system. The receiver subsystem is $$\dot{x}_r=\sigma(y-x_r)$$

$$\dot{z}_r=x_ry-bz_r \tag{29}$$

The nonlinear filter for demodulating the signal is $$\dot{w}_0 = (k-1)y - x_r z_r - kw_0 \tag{30}$$

$$\dot{w}_1 = x_r - kw_1$$

$$\dot{r}_f = \frac{q\,sgn(w_1)}{1+|w_1|}(y - w_0 - w_1 r_f)$$

where k and q are filter parameters that are chosen for optimal performance. In (30), $r_f$ is the filtered estimate of the transmitted signal encoded using r=r(t) in (28).

Figure 4:
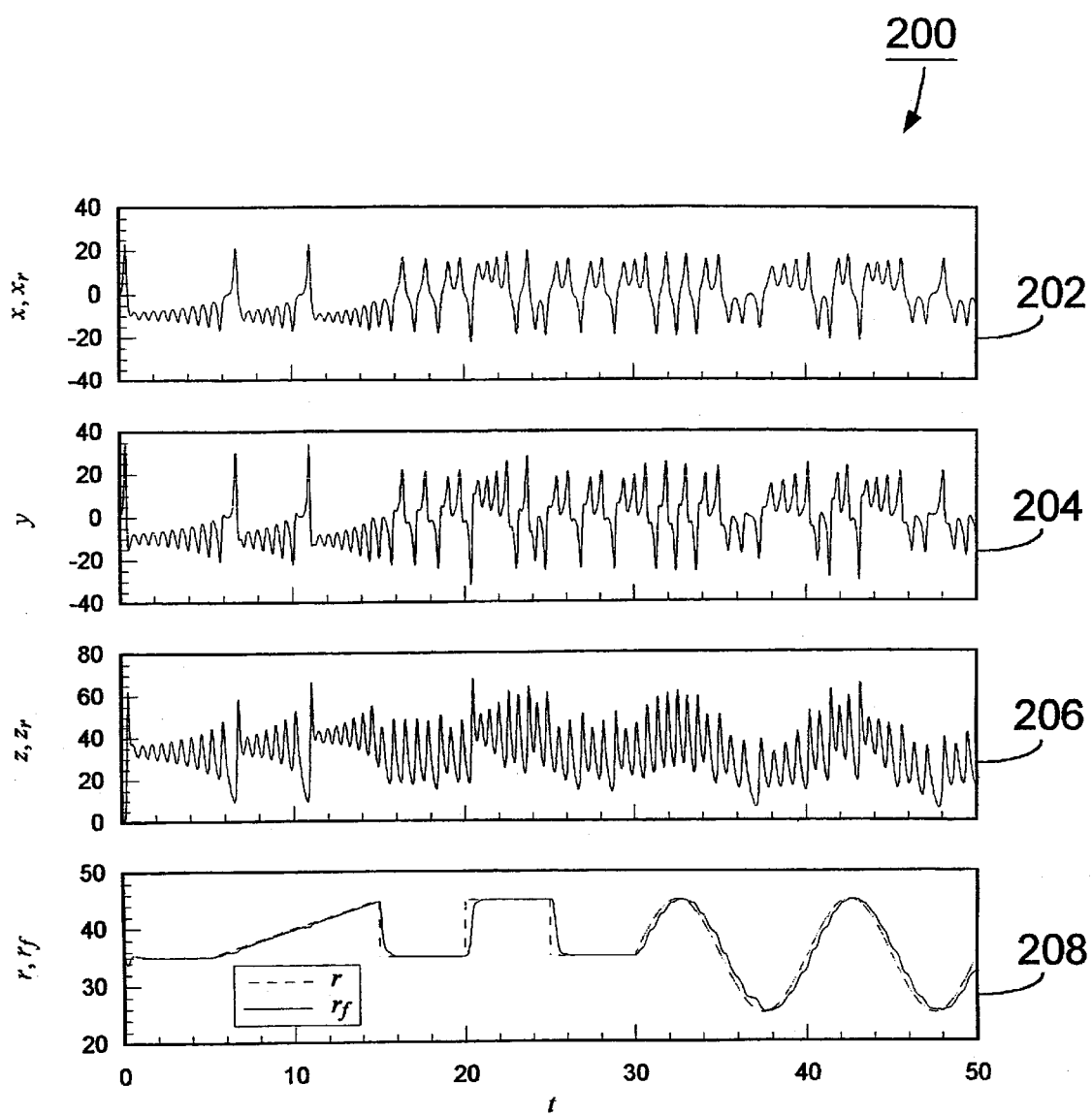
FIG. 4 comprises four graphs showing simulation results for a communication system based on a Lorenz chaotic oscillator.

An example of a simulation 200 of communication with the Lorenz system is shown in FIG. 4. This example was generated by integrating equations (28)–(30) numerically using a numeric simulator. For this example, b=8/3, σ=10, k=20, and q=20. The first three plots 202, 204, 206 show the x, y, and z states derived from equations (28). The first plot 202 and the third plot 206 have the $x_r$ and $z_r$ states from equation (29) overlaid. Synchronization is achieved very quickly on the shown time scale, and the corresponding states in the transmitter and receiver are indistinguishable in the plots. The fourth plot 208 shows the applied modulation r(t) and the recovered signal $r_f$ derived via (30). For the range of r used, the oscillator remains chaotic. The agreement in the fourth plot 208 demonstrates the capability of the proposed approach to transmit and receive information using a chaotic carrier.

The Rossler system is also widely used for studying the nonlinear dynamics of chaos. This system is given by $$\dot{x}=-y-z$$

$$\dot{y}=x+ay$$

$$\dot{z}=b+z(x-c) \tag{31}$$

where x, y, and z are the states of the system and a, b, and c are fixed parameters.

For synchronization, only the x-z subsystem is stable, and then only for restricted parameter ranges. Thus, this subsystem is used to demonstrate communication, with y as the transmitted signal and a=a(t) the corresponding modulation parameter.

The receiver subsystem is $$\dot{x}_r = -y - z_r$$

$$\dot{z}_r = b + z_r(x_r - c) \quad (32)$$

and the demodulation filter is $$\dot{w}_0 = x_r + k_y - k w_0 \quad (33)$$

$$\dot{w}_1 = y - k w_1$$

$$\dot{\alpha}_f = \frac{q \operatorname{sgn}(w_1)}{1 + |w_1|} (y - w_0 - w_1 \alpha_f)$$

A simulation 220 of modulation and demodulation for the Rossler system is shown in FIG. 5. Plots 222, 224, 226 show the x, y, and z states derived from equations (31) and plot 228 shows an estimation of the demodulated signal. For this example, equations (31)–(33) were integrated numerically using b=2, c=4, k=8, and q=8. Again, it is noted that the filter demodulated the chaotic waveform and extracted the encoded signal.

4. A Generalized Filter for Parameter Estimation in Accordance With the Invention The invention is not limited to use with chaotic waveforms. A general parameter estimation filter is now described. This filter can be applied to a variety of waveforms, including periodic, quasi periodic and even chaotic waverorms.

The goal of the present analysis is to derive a filter for estimating and tracking the instantaneous frequency of a received signal. This example could have practical application in an alternative method for implementing a FM receiver.

The transmitted signal can be represented by the form $$x(t) = A \sin(\omega t + \delta) \quad (1A)$$

where the amplitude A, the frequency $\omega$, and the phase $\delta$ are fixed or slowly varying parameters. In particular, frequency modulation can be effected by changing $\omega$ with an information signal. The goal of a FM demodulator then is to estimate and track the parameter $\omega$.

It is noted that the signal in equation (1A) can be modeled by the following system $$\dot{x} = \beta x - (\beta^2 + \omega^2) y$$

$$\dot{y} = x - \beta y \quad (2A)$$

where a dot denotes differentiation with respect to time and $\beta > 0$ is an arbitrary damping coefficient. That equation (1A) is a solution to (2A) can be verified by direct substitution. Although the signal in equation (1A) may be generated by a number of different systems, many of which are far more complex than the system in (2A), the "fictitious" model presented in equation (2A) is convenient for the present analysis and can be exploited for constructing an estimator for $\omega$, regardless of the true source of the received signal.

The first stage of a demodulator consists of a synchronous subsystem, which creates an estimate of y(t) for a received x(t). It is $$\dot{y} = x - \beta y_r \quad (3A)$$

where $y_r(t)$ constitutes an estimate for y(t). In view of (3), the form used in (2A) can be better appreciated. First, the subsystem (3A) is globally stable for $\beta > 0$. Second, the quantity to be estimated, namely $\omega$, does not appear in the first stage of the demodulator; thus, (3A) provides a true estimate of y without knowing $\omega$ a priori. Third, the first equation of (2A) is available to derive an estimate of the frequency $\omega$ in the receiver.

As a first consideration, demodulation can be performed using $$\omega^2 = \frac{\beta x - \beta^2 y - \dot{x}}{Y y} \quad (4A)$$

which is derived from simply inverting the first state equation in (2A) for the frequency $\omega$. However, this naive approach is deficient for two reasons. First, must be derived from x at the receiver, and time differentiation will magnify any noise in the system. Second, the estimate in (4A) is singular for y=0; thus, the frequency estimate will suffer for small values of y.

As an alternative to the naive estimate (4A), the following construction is proposed. The state $y_r$ from (3A) is substituted into the first equation of (2A), yielding $$\dot{x} = \beta x - (\beta^2 + \omega^2) y_r \quad (5A)$$

It is desirable to integrate (5A) to get rid of $\dot{x}$; however, it is undesirable to introduce a requirement to know something about the system's initial conditions. To this end, adding a decay term kx to both sides of (5A) and multiplying by an integration factor $e^{kt}$ yields $$\frac{d}{dt}(x e^{kt}) = e^{kt}[(\beta + k)x - (\beta^2 + \omega^2) y_r] \quad (6A)$$

where k>0 is an arbitrary constant. Integrating from an initial time $t_0$ to the current time t and dividing by the integration factor gives $$x - x_0 e^{k(t_0 - t)} = e^{-kt} \int_{t_0}^{t} [(\beta + k)x - (\beta^2 + \omega^2) y_r] e^{kt'} dt' \quad (7A)$$

where $x_0$ is an initial condition applied at $t=t_0$. As t increases, the term containing $x_0$ in (7A) decays exponentially; therefore, it is negligible. The parameter $\omega$ varies rigorously with time in an FM signal. However, it is assumed that $\omega$ varies slowly with respect to the time constant contained in k. Thus, $\omega^2$ can be factored out of the integral in (7A), which simplifies to gives $$x - x_0 e^{k(t_0 - t)} = e^{-kt} \int_{t_0}^{t} [(\beta + k)x - (\beta^2 + \omega^2) y_r] e^{kt'} dt' \quad (8A)$$

Solving for $\omega^2$ yields $$\omega^2 = \frac{x - w_0}{w_1} \quad (9A)$$

where $$w_0 = \sim e^{-kt} \int_{t_0}^{t} [(\beta+k)x - \beta^2 y_r] e^{kt'} dt' \quad (10A)$$

$$w_1 = \omega^2 e^{-kt} \int_{t_0}^{t} y_r e^{kt'} dt'$$

The estimate given by (9A) and (10A) is an improvement over the naive estimate in (4A) in that is not required.

The explicit form (10A) is not convenient for continuous time integration using, say, an analog electrical circuit. However, differentiation of (10A) with respect to time yields $$\dot{w}_0 = (\beta+k)x - \beta^2 y_r - kw_0 dt'$$

$$\dot{w}_1 = -y_r - kw_1 \quad (11A)$$

resulting in a state-equation form for $w_0$ and $w_1$ that is more usefull for practical implementation.

It is recognized that any realistic instantaneous estimate derived using (9A) should be positive; thus, it is reasonable to replace (9A) with $$\omega^2 = \frac{|x - w_0|}{|w_1|} \quad (12A)$$

The instantaneous estimate for the squared frequency given by (12A) is singular for $w_1=0$. In practice, equation (12A) will suffer for small $w_1$, and the singularities will result in spikes in the frequency estimate. To remove these undesirable spikes, a low-pass filter can be constructed of the form $$\dot{\lambda} = Q\left[\frac{|x - w_0|}{|w_1|} - \lambda\right] \quad (13A)$$

To lessen the impact of the singularities, the filter parameter is defined as $$Q = q|w_1| \quad (14A)$$

where q is an arbitrary constant. With (14A), the low-pass filter (13A) is then $$\dot{\lambda} = q(|x - w_0| - \lambda|w_1|) \quad (15A)$$

As a result, a simple FM demodulator consists of four continuous-time state equations: the synchronous subsystem (3A), the two intermediate states in (10A), and the low-pass filter (15A). To emphasize the simplicity of this FM demodulator, these four state equations are restated here to show the complete estimator is $$\dot{y}_r x = -\beta y_r$$

$$\dot{w}_0 = (\beta+k)x - \beta^2 - kw_0$$

$$\dot{w}_1 = -y_r - kw_1$$

$$\dot{\lambda} = q(|x-w_0| - \lambda|w_1|)$$

$$\omega_e = \sqrt{\lambda} \quad (16A)$$

where x is the input to the system and $\omega_e$ is the output that constitutes an estimate for the instantaneous frequency $\omega$. The parameters $\beta$, k, and q can be chosen to optimize the effectiveness of the frequency estimator for a particular application.

Figure 6:
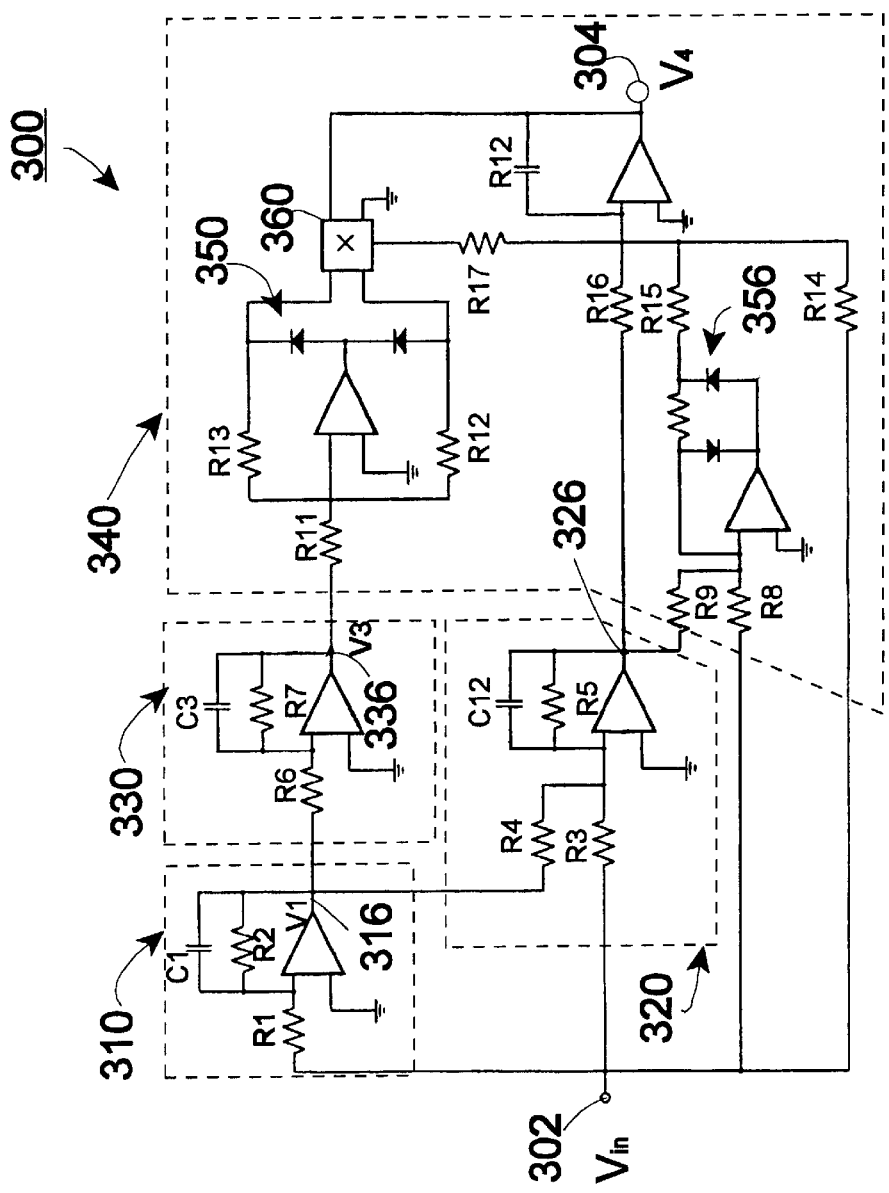
FIG. 6 is a schematic diagram of a generalized frequency estimating filter in accordance with the invention.

As shown in FIG. 6, the derivation presented for the frequency estimator is well suited for implementation in an electrical circuit 300. Due to the design simplicity and stability characteristics, a robust implementation can be developed using a minimal number of components.

The circuit 300 in FIG. 6 implements the estimator described by equation (16A). The estimator (16A) consists of four state equations, the first three of which are linear and are implemented using conventional integrator circuits 310, 320, 330. The last equation is nonlinear and requires a slightly more complex circuit 340. Specifically, precision rectifier circuits employing diodes 350 are required to perform the absolute value functions, and a commercially available special-purpose integrated circuit (IC) 360 is used to perform multiplication of analog signals.

To establish that (16A) models the circuit shown in FIG. 6, it is necessary to define the dependent variables:

$$x = -v_{in}$$

$$y = v_1$$

$$w_0 = v_2$$

$$w_1 = v_3$$

$$\lambda = v_4 \quad (17A)$$

where the various voltages are defined in the schematic. Specifically, $v_{in}$ is the input sinusoidal voltage of varying frequency, and $v_4$ is the output voltage that is proportional to the square of the input frequency. The following design constraints must also be imposed:

$$R_3 = \frac{R_2 R_5}{R_2 + R_5} \quad (18A)$$

$$R_4 = \frac{R_2^2}{R_1}$$

$$R_6 = R_1$$

$$R_7 = R_5$$

$$R_8 = R_9 = R_{10}$$

$$R_{11} = R_{12} = R_{13}$$

$$R_{14} = 2R_{15} = R_{16} = \frac{R_{17}}{G}$$

$$C_1 = C_2 = C_3 = C_4$$

where G is the voltage gain in the multiplier IC. The filter parameters b, k, and q are set using $$\beta = \frac{R_1}{R_2} \quad (19A)$$

$$k = \frac{R_1}{R_5}$$

$$q = \frac{R_1}{R_{14}}$$

With (17A), (18A), and (19A), it is a tedious yet straightforward exercise to verify that the circuit shown in FIG. 6 is modeled by the state equations in (16A). The parameter $\omega_e$ is not explicitly represented in the electrical circuit. However, such circuitry is known to the art and would be appended to the output to perform a square-root operation if the exact value of $\omega_e$ is required.

Practical values for the parameters in one illustrative embodiment are:

$$\beta = k = q = 4.5 \quad (20A)$$

Furthermore, in this embodiment, it is desirable to design the circuit to operate around 1 KHz. Thus, the components shown in Table 3 may be used in this embodiment. In this table, $R_{17}$ was chosen using $G=\frac{1}{10}$, which is appropriate for the AD633 multiplier IC.

TABLE 3

Circuit values used for particular implementation of frequency estimator.

| Component | Nominal Value or Device |
|---|---|
| $R_1$, $R_6$, $R_8$, $R_9$, $R_{10}$, $R_{11}$, $R_{12}$, $R_{13}$ | 10 KW |
| $R_2$, $R_5$, $R_7$, $R_{14}$, $R_{16}$ | 2.2 KW |
| $R_3$, $R_{15}$ | 1.1 KW |
| $R_4$ | 470 W |
| $R_{17}$ | 220 W |
| $C_1$, $C_2$, $C_3$, $C_4$ | 0.012 mF |
| $U_1$, $U_2$, $U_3$ | TL082, Dual BiFET Op Amp |
| $U_4$ | AD633, Analog Multiplier |
| $D_1$, $D_2$, $D_3$, $D_4$ | 1N914, Silicon Diode |

Essentially, the circuit 300 shown in FIG. 6 employs a first circuit element 310, responsive to the signal x(t) 302, having a first voltage output 316 equal to $y_r$, given by an integral of $(x-\beta y_r)$ with respect to time, wherein x is an instantaneous value of x(t). A second circuit element 320, is responsive to the first voltage output 316 and the signal x(t) 302 and has a second voltage output 326 equal to $w_0$, given by an integral of $(\beta+k)x-\beta^2 y_r-kw_0$ with respect to time. A third circuit element 330 is responsive to the first voltage output 316 and has a third voltage output 336 equal to $w_1$, given by an integral of $(-y_r-kw_1)$ with respect to time. A fourth circuit element 340 is responsive to the signal x(t) 302, the second voltage output 326 and the third voltage output 336 and has a fourth voltage output 304 equal to $\lambda$, given by an integral of $q(|x-w_0|-\lambda|w_1|)$ with respect to time. The fourth voltage output 304 is an estimate of the square of the parameter $\omega$.

Figure 7:
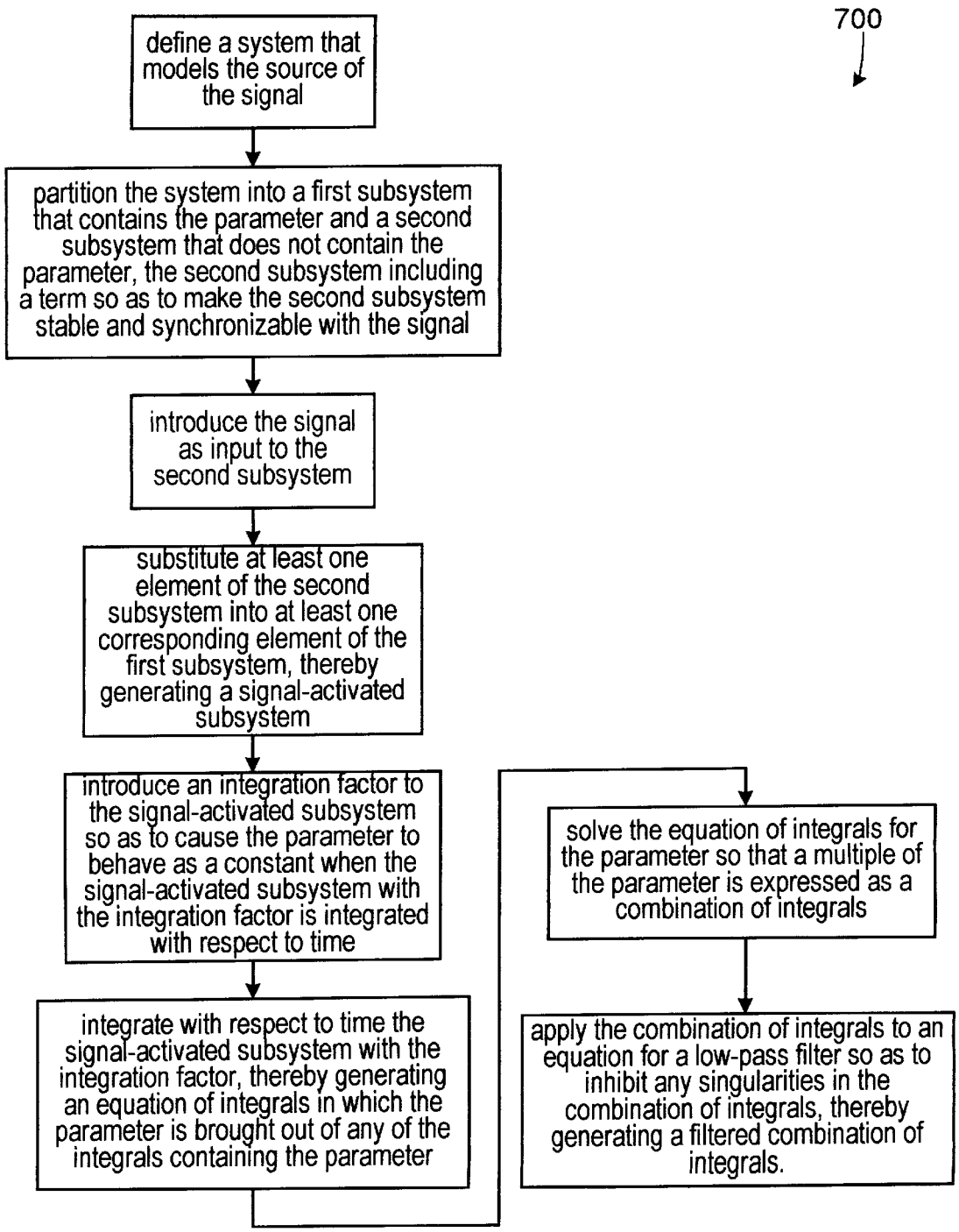
FIG. 7. is a flowchart showing one embodiment of the method of the invention.

A flowchart 700 demonstrating one embodiment of the method of the invention is shown in FIG. 7.

The above described embodiments are given as illustrative examples only. It will be readily appreciated that many deviations may be made from the specific embodiments disclosed in this specification without departing from the invention. Accordingly, the scope of the invention is to be determined by the claims below rather than being limited to the specifically described embodiments above.

What is claimed is:

1. A method of generating a filtered combination of integrals of combinations of states of a system used in estimating a value of a parameter that describes a property of a signal from a source, comprising a combination of circuit elements wherein each circuit element is an analog of one of a plurality of mathematical integrals of said filtered combination of integrals, the method comprising the steps of:
  a. defining a system that models the source of the signal, wherein the system is described by various states that evolve with respect to time;
  b. partitioning the system into a first subsystem that contains the parameter and a second subsystem that does not contain the parameter, the second subsystem including a term so as to make the second subsystem stable and synchronizable with the signal;
  c. introducing the signal as input to the second subsystem;
  d. substituting at least one state of the second subsystem into at least one corresponding state of the first subsystem, thereby generating a signal-activated subsystem;
  e. introducing an integration factor of the signal-activated subsystem to the signal-activated subsystem so as to cause the parameter to behave as a constant when the signal-activated subsystem with the integration factor is integrated with respect to time;
  f. integrating with respect to time the signal-activated subsystem with the integration factor, thereby generating an equation of integrals of combinations of states of the first subsystem in which the parameter is brought out of any of the integrals containing the parameter;
  g. solving the equation of integrals for the parameter so that a term proportional to the parameter is expressed as a combination of integrals derived from the equation of integrals; and
  h. applying the combination of integrals as an input to an equation for a low-pass filter so as to inhibit any singularities in the combination of integrals, thereby generating a filtered combination of integrals.

2. The method of claim 1, wherein the term is a decaying feedback term.

3. A method of creating a circuit for estimating a parameter that describes a property of a signal from a source, comprising the steps of:
  a. defining a system that models the source of the signal, wherein the system is described by various states that evolve with respect to time;
  b. partitioning the system into a first subsystem that contains the parameter and a second subsystem that does not contain the parameter, the second subsystem including a term so as to make the second subsystem stable and synchronizable with the signal;
  c. introducing the signal as input to the second subsystem;
  d. substituting at least one state of the second subsystem into at least one corresponding state of the first subsystem, thereby generating a signal-activated subsystem;
  e. introducing an integration factor of the signal-activated subsystem to the signal-activated subsystem so as to cause the parameter to behave as a constant when the signal-activated subsystem with the integration factor is integrated with respect to time;
  f. integrating with respect to time the signal-activated subsystem with the integration factor, thereby generating an equation of integrals of combinations of states of the first subsystem in which the parameter is brought out of any of the integrals containing the parameter;
  g. solving the equation of integrals for the parameter so that a term proportional to the parameter is expressed as a combination of integrals derived from the equation of integrals;
  h. applying the combination of integrals as an input to an equation for a low-pass filter so as to inhibit any singularities in the combination of integrals, thereby generating a filtered combination of integrals; and
  i. constructing a circuit comprising a plurality of circuit elements, wherein each circuit element is an analog of a mathematical integral of the filtered combination of integrals of combinations of the states of the system.

4. The method of claim 3, wherein the term is a decaying feedback term.

* * * * *